(12) United States Patent
Nihei

(10) Patent No.: US 8,567,026 B2
(45) Date of Patent: Oct. 29, 2013

(54) PIEZOELECTRIC FILM POLING METHOD

(75) Inventor: Yasukazu Nihei, Kanagawa-ken (JP)

(73) Assignee: FUJIFILM Corporation, Tokyo (JP)

( * ) Notice: Subject to any disclaimer, the term of this patent is extended or adjusted under 35 U.S.C. 154(b) by 935 days.

(21) Appl. No.: 12/485,567

(22) Filed: Jun. 16, 2009

(65) Prior Publication Data

US 2009/0307885 A1  Dec. 17, 2009

(30) Foreign Application Priority Data

Jun. 17, 2008  (JP) .................................. 2008/157691

(51) Int. Cl.
*H04R 17/10* (2006.01)
*H02N 2/04* (2006.01)

(52) U.S. Cl.
USPC ............. 29/25.35; 29/846; 310/357; 427/100

(58) Field of Classification Search
USPC ................... 29/25.35, 593, 890.1, 842, 846;
310/346, 357, 359, 348; 347/70, 71;
427/100
See application file for complete search history.

(56) References Cited

U.S. PATENT DOCUMENTS

| | | | |
|---|---|---|---|
| 6,083,415 A | 7/2000 | Kimura et al. | |
| 6,147,438 A | 11/2000 | Nishiwaki et al. | |
| 2003/0176032 A1* | 9/2003 | Ramesh | 438/200 |
| 2007/0097182 A1* | 5/2007 | Kubota et al. | 347/70 |
| 2008/0079783 A1 | 4/2008 | Fujii | |
| 2008/0081128 A1 | 4/2008 | Fujii | |
| 2008/0081215 A1 | 4/2008 | Fujii | |
| 2008/0081216 A1 | 4/2008 | Fujii et al. | |

FOREIGN PATENT DOCUMENTS

| JP | 61-287183 A | | 12/1986 |
|---|---|---|---|
| JP | 04151253 A | * | 5/1992 |
| JP | 5-160462 A | | 6/1993 |
| JP | 11-228226 A | | 8/1999 |
| JP | 11-307832 A | | 11/1999 |
| JP | 2006-196739 A | | 7/2006 |
| JP | 2008-78267 A | | 4/2008 |

OTHER PUBLICATIONS

Machine Language Translation of Japanese Patent Publication JP 5-160462.*
Japanese Office Action dated Feb. 19, 2013 issued in corresponding Japanese patent application No. 2008-157691.

* cited by examiner

*Primary Examiner* — A. Dexter Tugbang
(74) *Attorney, Agent, or Firm* — Birch, Stewart, Kolasch & Birch, LLP

(57) ABSTRACT

A piezoelectric film poling method in which, with respect to an unpoled piezoelectric film formed on a substrate by a vapor phase growth method and having a Curie point Tc not higher than 300° C., an electric field greater than a coercive electric field of the film is applied in a predetermined direction under a temperature condition not higher than 0° C. to orient spontaneous polarization of the film in the predetermined direction.

6 Claims, 4 Drawing Sheets

PIEZOELECTRIC FILM POLING METHOD

BACKGROUND OF THE INVENTION

1. Field of the Invention

The present invention relates to a poling method for a piezoelectric film and a manufacturing method for a piezoelectric element structure that includes a process of poling a piezoelectric film by the poling method.

2. Description of the Related Art

A piezoelectric device which includes a piezoelectric film having piezoelectricity, in which the film stretches or contracts according to the applied electric field strength, and an electrode for applying an electric field to the film is used as an actuator mounted on an inkjet recording head and the like.

As for piezoelectric materials, composite oxides having a perovskite structure, such as lead zirconate titanate (Pb(Zr, Ti)O$_3$, hereinafter, "PZT") and the like are known. Such a material is a ferromagnetic substance having spontaneous polarization property in the absence of electric field. It is known that PZT doped with any of various donor ions having a higher valence number than that of the ion to be substituted has improved properties in ferroelectric performance and the like and a reduced Curie temperature in comparison with pure PZT. As donor ions for substituting A-site Pb$^{2+}$, various types of lanthanoid cations, such as Bi$^{3+}$, La$^{3+}$, and the like are known, and as donor ions for substituting B-site Zr$^{4+}$ and/or Ti$^{4+}$, V$^{5+}$, Nb$^{5+}$, Ta$^{5+}$, Sb$^{5+}$, Mo$^{6+}$, W$^{6+}$, and the like are known.

In order to use a piezoelectric body as a piezoelectric element, it is necessary to pole the piezoelectric body to orient the spontaneous polarization in a predetermined direction in advance. As for the poling method, it is common to form an electrode on each of the upper and lower surfaces of the piezoelectric body and to apply an electric field between the electrodes under a temperature condition of around 100° C.

Japanese Unexamined Patent Publication No. 5(1993)-160462 describes a polarization method that saturation polarizes a piezoelectric body in one direction and reversely polarizes the body by applying an electric field in a temperature from 0 to −50° C., thereby obtaining a desired polarizability value lower than that of the initial saturation polarization. Here, as the method for saturation poling the piezoelectric body, Japanese Unexamined Patent Publication No. 5 (1993) -160462 more specifically describes a method in which the polarization is performed on the piezoelectric body of 0.2 mm thick in an insulating oil under a condition of 600V at 80° C. for 30 minutes.

Recently, the thickness of piezoelectric bodies of piezoelectric elements has been reduced with improved piezoelectric properties, and now a piezoelectric element having a piezoelectric film of less than 100 μm thick is proposed.

Piezoelectric films may be formed by various types of film forming methods, such as sputtering, deposition, sol-gel process, laser abrasion, metal organic deposition (MOD), metal organic chemical vapor deposition (MOCVD), and the like.

It is known that, among these methods, when a piezoelectric film is formed by sputtering, the piezoelectric film has spontaneous polarization oriented in a direction from the side of the substrate toward the side of the film surface just after formed without poling.

In order to use a piezoelectric film formed on a substrate by sputtering as a piezoelectric element, the film is formed on the substrate with a lower electrode layer formed thereon in advance, i.e., on the lower electrode, and an upper electrode layer is formed on the piezoelectric film. When a piezoelectric element structure with a piezoelectric film having spontaneous polarization oriented in the direction from the substrate side toward the surface of the film (in the direction from the lower electrode side toward the upper electrode side) is put into practical use, it is necessary to drive the structure by (1) setting the upper electrode to a ground potential and the lower electrode to a positive potential as an address electrode, or by (2) setting the lower electrode to a ground potential and the upper electrode to a negative potential as an address electrode in order to align the orientation of the electric field with that of the spontaneous polarization.

In the case of (1) above, it is necessary to make the lower electrode on the substrate side to individual electrodes, which gives rise to a problem that the manufacturing process is complicated. In the case of (2) above, on the other hand, a negative voltage drive IC is required, which is larger than a positive voltage drive IC. This poses problems that the overall size of a device having the negative voltage drive IC is increased, the number of IC elements producible from one wafer is reduced, and the device cont is increased since the negative voltage drive IC is more expensive than the positive voltage drive IC.

Consequently, it is desirable that the lower electrode is not separated into individual electrodes and driven by a positive voltage drive IC by reversing the spontaneous polarization of a piezoelectric film. As for the reverse polarization method for reversing the spontaneous polarization of a piezoelectric film, a method that applies a voltage between the upper and lower electrodes sandwiching the piezoelectric film may be used, as in conventional poling. Further, it is desirable that the spontaneous polarization of piezoelectric films of a plurality of piezoelectric elements of a piezoelectric element structure is reversed at a time. In this case, a voltage is applied between the electrodes of each piezoelectric film and the spontaneous polarization of piezoelectric films of a multiple elements is reversed at a time.

An experiment conducted by the inventor of the present invention, however, showed the following problem. That is, when the simultaneous polarization reversal process described above was performed on a piezoelectric element structure under a temperature of around 100° C., the element defect rate due to film destruction at the time of voltage application amounted to as high as more than 30%, causing a problem that the piezoelectric element structure could not be put into practical use.

Generally, it is known that the film destruction at the time of voltage application is triggered by a portion of a piezoelectric film having a relatively low electric resistance, such as compositionally or structurally defective portion, or a portion of the piezoelectric film having a shape that is likely to attract charges, such as a defective surface area or a pore area. A continuous voltage application to the piezoelectric film causes heat to be generated in the charge concentration area in the trigger portion and the temperature of the piezoelectric film is locally increased. It is thought that a rapid decrease in the resistance in the locally heated area leads to charge concentration and film destruction.

When poling a piezoelectric element structure, if a voltage is applied between a solid lower electrode common to a plurality of elements and an upper electrode provided with respect to each element simultaneously, the total area of the electrode is increased and the destruction due to charge concentration is likely to occur, since the total amount of charges is increased as the total electrode area is increased. Consequently, it has been difficult to uniformly reverse the polarization of a piezoelectric element structure, resulting in a high defect rate and the difficulty in putting the piezoelectric element structure into practical use.

The problem of film destruction at the time of poling is significant for Pb system piezoelectric bodies having many composition defects of Pb dropouts at the time of forming. In addition, the problem is also significant for doped PZT systems or relaxor system Pb doped PZT having a low Curie point. Further, a piezoelectric film of less than 100 μm is likely to be destroyed by voltage application in comparison with a bulk piezoelectric body.

The present invention has been developed in view of the circumstances described above, and it is an object of the present invention to provide a piezoelectric film polarization method for orienting the spontaneous polarization of a piezoelectric film in a predetermined direction without destruction. It is a further object of the present invention to provide a method for manufacturing a practical piezoelectric element structure with a piezoelectric film having spontaneous polarization oriented in a direction from an upper electrode toward a lower electrode.

SUMMARY OF THE INVENTION

A poling method of the present invention is a method in which, with respect to an unpoled piezoelectric film formed on a substrate by a vapor phase growth method and having a Curie point Tc not higher than 300° C., an electric filed greater than a coercive electric field of the film is applied in a predetermined direction under a temperature condition not higher than 0° C. to orient spontaneous polarization of the film in the predetermined direction.

The poling method of the present invention is particularly suitable when the unpoled piezoelectric film has a pillar crystal structure and the spontaneous polarization of the film is oriented in a direction from the side of the substrate toward the side of the deposition surface.

The term "coercive electric field" as used herein refers to an electric filed at which the direction of the spontaneous polarization is reversed. The term "piezoelectric film" as used herein refers to a piezoelectric body formed on a substrate with a thickness not greater than 100 μm, and does not include those adjusted in thickness by polishing, bonded to a substrate after formed, and the like. The poling method of the present invention is particularly suitable for a piezoelectric film with a thickness not greater than 20 μm.

A piezoelectric element structure manufacturing method of the present invention is a method for manufacturing a piezoelectric element structure having a piezoelectric element which includes a substrate on which a lower electrode layer, a piezoelectric film, and an upper electrode layer are stacked in this order, the method including the steps of:

forming, as the piezoelectric film, a piezoelectric film having a Curie point Tc not higher than 300° C. by a vapor phase growth method in a film forming process in which the lower electrode layer, piezoelectric film, and upper electrode layer are serially formed on the substrate; and applying an electric field, greater than a coercive electric field of the piezoelectric film, to the piezoelectric film in a direction from the upper electrode layer toward the lower electrode layer under a temperature condition not higher than 0C to manufacture a piezoelectric element structure having spontaneous polarization oriented in the direction from the upper electrode layer toward the lower electrode layer.

Preferably, the piezoelectric film is formed of a perovskite oxide doped with at least Pb.

Preferably, as the piezoelectric film, a piezoelectric film having a pillar crystal structure is formed using a sputtering method as the vapor phase growth method.

Preferably, the piezoelectric film is formed with a thickness not greater than 20 μm.

According to the poling method of the present invention, with respect to an unpoled piezoelectric film formed on a substrate by a vapor phase growth method and having a Curie point Tc not higher than 300° C., an electric field greater than a coercive electric field of the film is applied in a predetermined direction under a temperature condition not higher than 0° C. This may prevent temperature rise of the piezoelectric film when the electric field is applied, whereby film destruction due to leakage current may be prevented. Thus, the method may orient spontaneous polarization of the piezoelectric film in a predetermined direction without causing film destruction.

According to the piezoelectric element structure manufacturing method of the present invention, after a piezoelectric film is formed, an electric field directed from the upper electrode layer toward lower electrode layer (from the side of the deposition surface to the side of the substrate) is applied under a temperature condition not higher than 0° C. This may prevent temperature rise of the piezoelectric film when the electric field is applied, whereby film destruction due to leakage current may be prevented. Thus, the method may orient spontaneous polarization of the piezoelectric film in the predetermined direction without causing film destruction. That is, a practical piezoelectric element structure with reduced piezoelectric element defects, such as cracks and voids, and spontaneous polarization oriented in the direction from the upper electrode to the lower electrode may be manufactured.

DESCRIPTION OF THE PREFERRED EMBODIMENTS

Hereinafter, an embodiment of the present invention will be described with reference to the accompanying drawings.

[Piezoelectric Film Polarization Method]

The inventor of the present invention has found out that the spontaneous polarization of a piezoelectric film having Curie point Tc not higher than 300° C. can be saturation poled in a predetermined direction without causing destruction to the film by poling the film at a low temperature not higher than a predetermined temperature.

That is, the present invention is characterized in that spontaneous polarization of an unpoled piezoelectric film, formed on a substrate by a vapor phase growth method and having Curie point Tc not higher than 300° C., is oriented in a predetermined direction by applying an electric field to the film greater than a coercive electric field of the film in the predetermined direction under a temperature condition not higher than 0° C.

Figure 1:
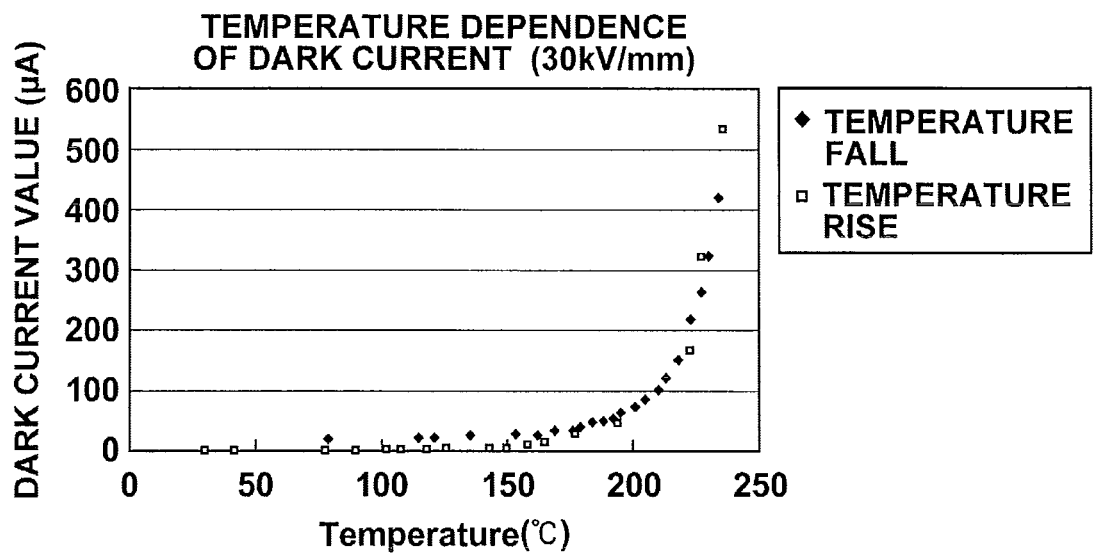
FIG. 1 is a graph illustrating temperature dependence of dark current in an Nb doped PZT piezoelectric film.

FIG. 1 is a graph illustrating measurement results of temperature vs current value (temperature rise curve and temperature fall curve) in an Nb doped PZT piezoelectric film having a Curie point of about 250° C., in which dark current values were measured by increasing and decreasing the temperature while applying a voltage of 30 kV/mm to the film.

The graph shows that the resistance of the film is reduced rapidly and the current value is increased as the temperature approaches to the Curie point (about 250° C.). In the temperature increase process, the dark current value is substantially 0 from room temperature to about 150° C., which is then begins to increase gradually after 15000 and increases rapidly after 2000C. As described earlier, it is thought that, as heat generation progresses in a charge concentration area at the time of voltage application, the resistance of the area is reduced rapidly, causing further concentration of charges and leading to film destruction. It has been confirmed, by a thermoviewer, that the temperature of a trigger portion, where charge concentration is likely to occur due to defect or the like, rises from 200 to 300° C. when a polarization reversal process is performed at room temperature.

Taking the Nb doped PZT shown in FIG. 1 as an example, even when a charge concentration occurs in a trigger portion of defect or the like, the charge concentration does not lead to film destruction if the temperature of the trigger portion does not rise to a point adjacent to the Curie point. Therefore, as in the polarization method of the present invention, if poling a piezoelectric film while actively cooling the film below 0° C., even if a charge concentration occurs in a portion of the film where charges are likely to be attracted, such as compositionally or structurally defective portion, by voltage application, the heat generation in the charge concentrated portion can be suppressed, thereby film destruction may be prevented.

In particular, for a Pb doped perovskite oxide film, like a PZT piezoelectric film, the advantageous effects of applying the poling performed under a low temperature not higher than 0° C. are significant, since a Pb composition defect is likely to occur in the film when formed by sputtering and a charge concentration is likely to occur in the composition defect area.

Further, increase in the compositions of PZT systems tends to decrease in the Curie point in comparison with a three-composition PZT system. Such PZT systems include, for example, a doped PZT system with A-site $Pb^{2+}$ substituted by each of various types of lanthanoid cations, such as $Bi^{3+}$, $La^{3+}$, and the like and/or with B-site $Zr^{4+}$ and/or $Ti^{4+}$ substituted by $V^{5+}$, $Nb^{5+}$, $Ta^{5+}$, $Sb^{5+}$, $Mo^{6+}$, $W^{6+}$, and the like, and a piezoelectric body doped with relaxor system Pb in which low valence number acceptor ions, such as $Ni^{2+}$, $Co^{2+}$, and the like are co-doped with high valence number donor ions, for example, a PZT system doped with $Pb(Ni_{1/3}Nb_{2/3})O_3$ and the like. Therefore, the advantageous effects of applying the present invention to piezoelectric films of these PZT systems, in which poling is performed on a piezoelectric film while actively cooling the film, are significant.

Further, as the film thickness is decreased the destruction probability due to charge concentrations is increased, so that the poling performed by voltage application under a low temperature is more advantageous for thin piezoelectric films, for example, piezoelectric films of not greater than 20 μm and further piezoelectric films of not greater than 10 μm.

Still further, as the temperature of a piezoelectric film is decreased, the probability of the film reaching the Curie point by heat generation is reduced, so that great effects will result. But, as the temperature of a piezoelectric film is decreased, the coercive electric field of the film increases, so that it is necessary to increase the application voltage at the time of poling. Further, the device structure for stabilizing the temperature becomes complicated if the temperature is reduced extremely, leading to cost increase. Therefore, it is desirable that the temperature is reduced at most to −50° C. and more preferably to −20° C.

[Piezoelectric Element Structure Manufacturing Method]

Figure 2:
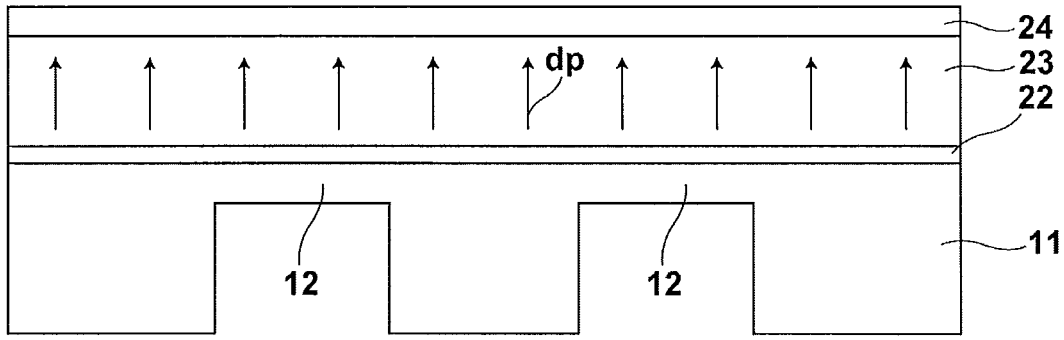
FIG. 2 is a cross-section of a relevant part of a piezoelectric element structure, illustrating a manufacturing process in a manufacturing method according to an embodiment of the present invention (part 1).
Figure 3:
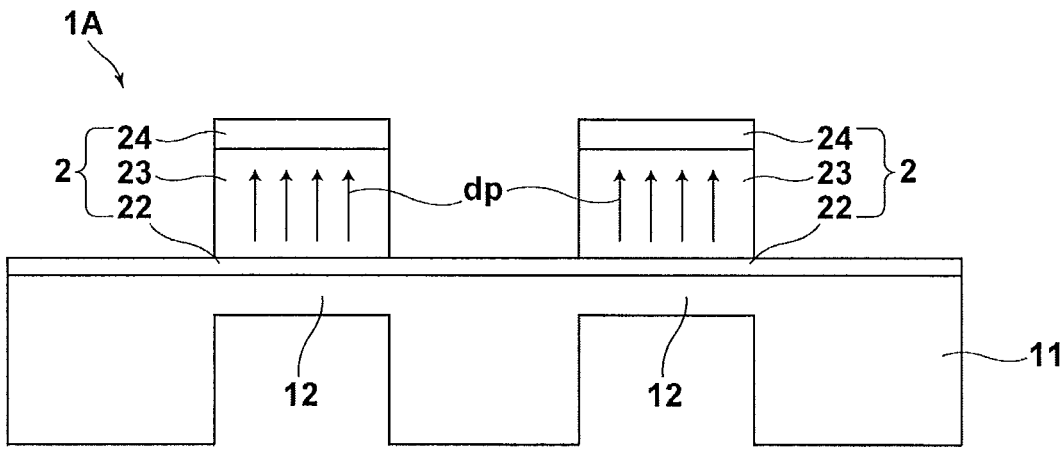
FIG. 3 is a cross-section of a relevant part of the piezoelectric element structure, illustrating a manufacturing process in the manufacturing method according to an embodiment of the present invention (part 2).
Figure 4:
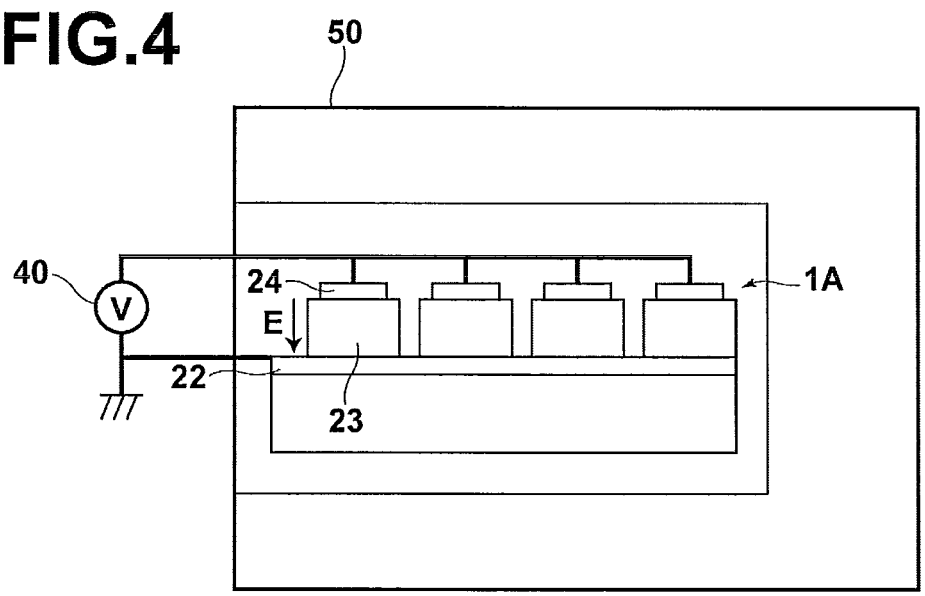
FIG. 4 is a cross-section of a relevant part of the piezoelectric element structure, illustrating a poling process in the manufacturing method according to an embodiment of the present invention.

A piezoelectric element structure manufacturing method using a piezoelectric film polarization method according to an embodiment of the present invention will be described with reference to FIGS. 2 to 6. FIGS. 2 and 3 are cross-sectional views of a relevant part of a piezoelectric element structure, illustrating a manufacturing process of the structure. FIG. 4 is a cross-sectional view of a relevant part of the piezoelectric element structure, illustrating a poling process performed thereon. FIG. 6 is a schematic plan view of piezoelectric element structure 1 obtainable by the manufacturing method of the present invention. Note that the components are not necessarily drawn to scale in order to facilitate visual recognition.

As illustrated in FIG. 2, substrate 11 having a plurality of vibration plates (diaphragms) 12 is provided, and lower electrode 22 is formed on substrate 11. A buffer layer or a contact layer may be formed on substrate 11, as required, before forming lower electrode layer 22. Thereafter, piezoelectric film 23 having a Curie point not higher than 300° C. is formed on lower electrode layer 22 by vapor phase growth with a thickness of not greater than 20 μm, and further upper electrode layer 24 is formed on piezoelectric film 23.

Here, piezoelectric film 23 of pillar crystal structure having a Curie point not higher than 300° C. and spontaneous polarization dp oriented in a direction from lower electrode 22 toward upper electrode 24 may be formed by sputtering under conditions to be described later.

Thereafter, as illustrated in FIG. 3, upper electrode layer 24 and piezoelectric film 23 are etched to form structure 1A separated according to each diaphragm 12.

Then, the spontaneous polarization of the piezoelectric films is oriented in a direction from upper electrode layer 24 toward lower electrode layer 22 using the piezoelectric film polarization method of the present invention. The poling is performed by placing structure 1A in cooling device 50 and under a temperature not higher than 0° C., as illustrated in FIG. 4.

Figure 5:
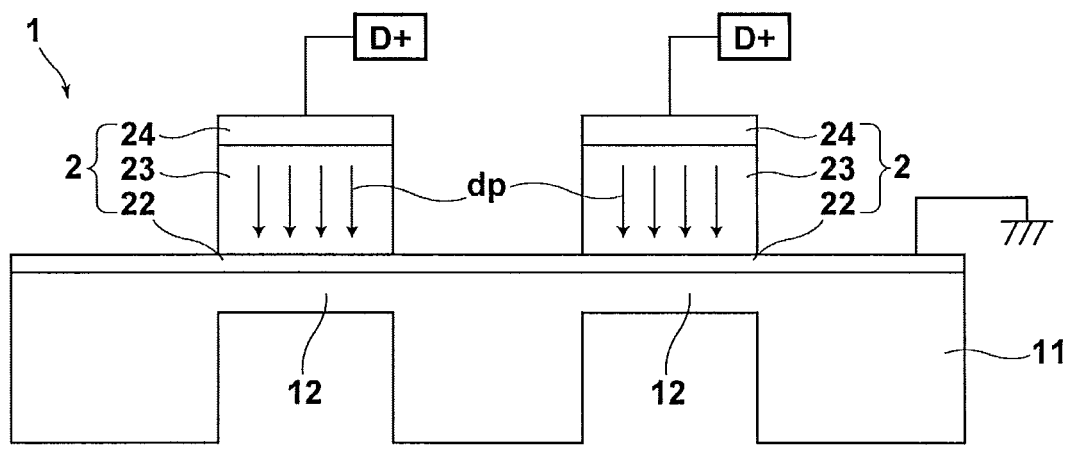
FIG. 5 is a cross-section of a relevant part of a piezoelectric element structure obtainable by the manufacturing method according to an embodiment of the present invention.
Figure 6:
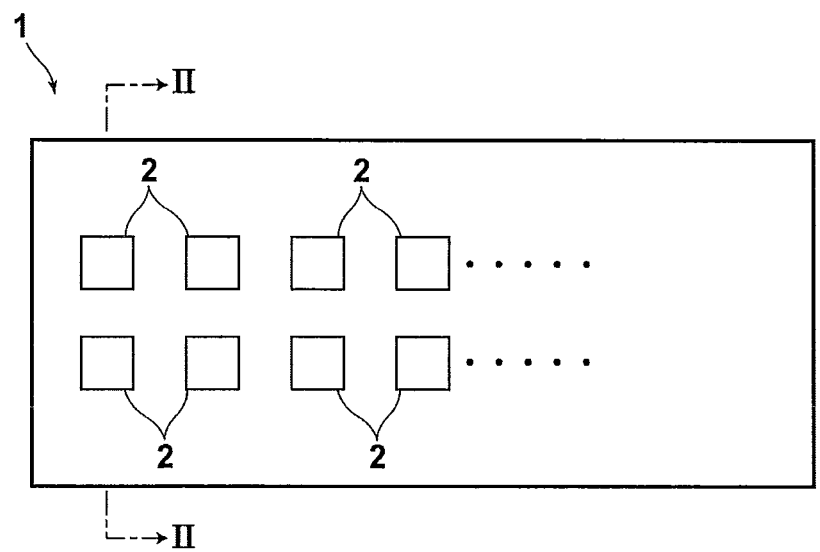
FIG. 6 is a schematic plan view of a piezoelectric element structure obtainable by the manufacturing method according to an embodiment of the present invention.

This poling process may yield piezoelectric element structures 1 having spontaneous polarization dp oriented in a direction from upper electrode 24 to lower electrode 22 (downward), as illustrated in FIG. 5.

In the aforementioned manufacturing method, the description has been made of a case in which the poling is performed after the piezoelectric film is separated for individual elements by etching, but the piezoelectric film may be separated for individual elements after poling. Further, the piezoelectric film may be a continuous film common to a plurality of piezoelectric elements, but it is desirable that the film is separated for individual elements to cause smooth elastic movement individually and to obtain a larger amount of displacement. Where the piezoelectric film is separated for individual elements, it is desirable that each upper electrode provided on each separated piezoelectric film is formed smaller than each film in the center on each film surface. This is because when the piezoelectric film is very thin, the distance between the upper and lower electrodes becomes small and leakage may occur along the sides of the film. But, the manufacturing process of the structure may be simplified if the piezoelectric film and upper electrode have substantially the same size.

(Piezoelectric Film Forming Method)

A film forming method for forming a piezoelectric film, having a Curie point not higher than 300° C., will now be described. Vapor phase growth methods for forming a piezoelectric film include CVD method, sputtering method, aerosol deposition method, and the like. Here, the sputtering method capable of forming a piezoelectric film having excellent piezoelectric property will be described. When a piezoelectric film of perovskite oxide doped with at least Pb is formed by the following film forming method, the film may have pillar crystal structure and spontaneous polarization oriented in a direction from the substrate side toward film surface. In the manufacturing method of the present invention, the film forming method is not limited to the sputtering method and any other vapor phase growth method may be used. Further, piezoelectric films formed by the film forming method are not limited to those having pillar crystal structure and include those that do not have pillar crystal structure.

The piezoelectric film is formed in a sputtering system. Factors influencing the property of a film formed by sputtering may include film forming temperature, type of substrate, base composition if base film is formed in advance, surface energy of substrate, film forming pressure, amount of oxygen in ambient gas, input power, distance between substrate and target, electron temperature and density in plasma, activated species density and lifetime in plasma.

The inventor of the present invention has studied some of many film forming factors that largely influence the property of piezoelectric films formed and have found out film forming conditions under which quality films may be formed as described in U.S. Patent Application Publication Nos. 20080081216, 20080079783, and 20080081215. More specifically, the inventor of the present invention has found out that a quality film can be formed by optimizing film forming temperature Ts and any of Vs–Vf (Vs is plasma potential in plasma and Vf is floating potential at the time of film forming), Vs, and distance D between substrate and target. That is, the inventor of the present invention plotted the properties of films in a graph with the horizontal axis representing film forming temperature Ts and vertical axis representing any one of Vs–Vf, Vs, and distance D, and found out that quality films can be formed in a certain range (conditions described below). Here, film forming temperature Ts is higher than the Curie point of a piezoelectric film to be formed.

(First Film Forming Condition)

The first film forming condition is a condition in which film forming temperature Ts and Vs–Vf are optimized. That is, film forming is performed under the condition in which film forming temperature Ts (° C.) and Vs–Vf, which is the difference between plasma potential Vs (V) in plasma and floating potential Vf (V) at the time of film forming satisfy Formulae (1) and (2) below. It is particularly desirable that film forming is performed under the condition that satisfies Formula (3) below.

$$Ts(° C.) \geq 400 \quad (1)$$

$$-0.2Ts+100 < Vs-Vf(V) < -0.2Ts+130 \quad (2)$$

$$10 \leq Vs-Vf(V) \leq 35 \quad (3)$$

Note that Vs–Vf can be varied, for example, by providing a grounding wire between the substrate and target. Note that the use of the deposition system described in U.S. Patent Application Publication No. 20080081128 allows control of plasma space potential by a simple method. The deposition system has a target holder for holding a target with a shield surrounding Fthe outer circumference of the holder on the substrate side and the potential state of plasma space can be adjusted by the shield.

(Second Film Forming Condition)

The second film forming condition is a condition in which film forming temperature Ts and the distance D (mm) between substrate B and target T are optimized. That is, film forming is performed under the condition in which film forming temperature Ts (° C.) and distance D (mm) between the substrate and target satisfy Formulae (4) and (5) or Formulae (6) and (7) below.

$$400 \leq Ts(° C.) \leq 500 \quad (4)$$

$$30 \leq D(mm) \leq 80 \quad (5)$$

$$500 \leq Ts(° C.) \leq 600 \quad (6)$$

$$30 \leq D(mm) \leq 100 \quad (7)$$

(Third Film Forming Condition)

The third film forming condition is a condition in which film forming temperature Ts and plasma potential Vs (V) in the plasma at the time of film forming are optimized. That is, film forming is performed under the condition in which film forming temperature Ts (° C). and plasma potential Vs (V) in the plasma at the time of the film forming satisfy Formulae (8) and (9) or Formulae (10) and (11) below.

$$400 \leq Ts(° C.) \leq 475 \quad (8)$$

$$20 \leq Vs(V) \leq 50 \quad (9)$$

$$475 \leq Ts(° C.) \leq 600 \quad (10)$$

$$Vs(V) \leq 40 \quad (11)$$

By forming a piezoelectric film of perovskite oxide represented, for example, by General Expression (P) below under the condition that satisfies any of the first to third film forming conditions, a quality piezoelectric film with high crystalline orientation can be obtained.

$$[(Pb_{1-x+\delta Ax})(Zr_y Ti_{1-y})_{1-z} M_z] O_w \quad (P)$$

where, Pb and A are A-site elements, in which A is at least one type of element other than Pb, and Zr, Ti, and M are B-site elements, in which M is at least one type of element selected from a group consisting of V and VI family elements.

$$x \geq 0, y > 0, \text{ and } z \geq 0.$$

General Expression (P) represents standard composition when $\delta=0$ and $W=3$, but these values may deviate within a range in which a perovskite structure is possible.

The perovskite oxide represented by General Expression (P) above is lead zirconate titanate (PZT) when $x=z=0$. Preferably, A is at least one type of metal element selected from La and Bi.

In particular, when a doped PZT oxide, like $x>0$ and/or $z>0$ in General Expression (P), is used in any one of the film forming method described above, a piezoelectric film having a Curie point not higher than 300° C. may be formed.

The piezoelectric film formed under any of the film forming conditions described above is a film having a multiple pillar crystals extending in a crystal growth direction (film forming surface side) from the substrate side with the spontaneous polarization oriented from the lower electrode toward upper electrode, i.e., from the substrate toward the piezoelectric film surface (film forming surface).

The growth direction of the pillar crystals may be any direction as long as it is nonparallel to the substrate surface, for example, a direction substantially perpendicular or oblique to the substrate surface. There is not a specific limitation on the average pillar diameter of the multiple pillar crystals forming the piezoelectric film, but preferably in the range from 30 nm to 1 μm. An excessively small average pillar diameter results in insufficient crystal growth for a ferroelectric body and desired piezoelectric performance may not be obtained, while an excessively large average pillar diameter may result in degraded shape accuracy after patterning.

In the foregoing, the piezoelectric film of PZT system, which is Pb doped perovskite oxide, has been described as an example. But the use of other piezoelectric materials, such as $BaTiO_3$ and $LiNbO_3$ in the sputtering method results in a piezoelectric film having identical spontaneous polarization to that of PZT system.

(Polarization Method)

As illustrated in FIG. 4, structure 1A is placed in cooling device 50 capable of controlling the temperature in a low temperature range, and a predetermined voltage is applied to piezoelectric films 23 after cooling structure 1A to a predetermined temperature not higher than 0° C. by the temperature control of cooling device 50. As for cooling device 50, for example, a commercially available cryostat may be used.

Lower electrode 22 of piezoelectric elements is grounded and each upper electrode 24 is connected to polarization reversal drive power source 40 so as to have a positive potential, thereby applying electric filed E between the upper and lower electrodes directing from upper electrode 24 to lower electrode 22 (directing from the film forming surface to substrate). The magnitude of the voltage applied between the two electrodes is selected so as to cause electric filed E greater than the coercive electric field of piezoelectric film 23 is applied to piezoelectric film 23.

For example, with respect to a piezoelectric film of Nb doped PZT having a Curie point of 280° C., the temperature inside of the cryostat is set to 0° C. and after stabilizing the temperature of the piezoelectric film to 0° C., a voltage of 10 kV/mm is continuously applied for 10 minutes.

(Piezoelectric Element Structure)

A construction of piezoelectric element structure 1 obtainable by the piezoelectric element structure manufacturing method according to the aforementioned embodiment will be described. As illustrated in FIGS. 5 and 6, piezoelectric element structure 1 includes substrate 11 on which a plurality of piezoelectric elements is formed. In the present embodiment, substrate 11 is a structure having a plurality of diaphragms, and piezoelectric element 2 is provided on each vibration plate 12. Each piezoelectric element 2 is an element having substrate 11 on which lower electrode layer 22, piezoelectric film 23 formed by a vapor phase growth method, such as sputtering, and upper electrode layer 24 stacked in this order, and an electric filed is applied in a thickness direction by upper electrode layer 24 and lower electrode layer 22.

Lower electrode 22 is formed on substantially the entire surface of substrate 11 and serves as the common electrode for a plurality of piezoelectric elements 2. On the other hand, piezoelectric film 23 and upper electrode 24 are formed in a separated pattern according to each vibration plate 12.

Spontaneous polarization dp of each piezoelectric film 23 of piezoelectric element structure 1 is oriented in a direction from upper electrode 24 toward lower electrode 22 (direction from the film forming surface to substrate 11).

As for substrate 11, a silicon substrate is preferably used from the viewpoint of thermal conductivity and workability. In particular, a laminated substrate, such as SOI substrate having silicon substrate on which $SiO_2$ film and Si active layer are stacked in this order or the like is preferably used. Further, a buffer layer for providing good grating matching or contact layer for improving adhesion between vibration plate 12 and lower electrode layer 22 may be provided between vibration plate 12 and lower electrode 22.

The vibration plate is not limited to the plate provided by partly machining substrate 11, as in the present embodiment, and it may be provided separately and bonded to the substrate. Where the vibration plate and substrate are provided separately, glass, stainless (SUS), yttrium-stabilized zirconia (YSZ), alumina, sapphire, and silicon carbide, as well as silicon may be used for the substrate.

There is not any limitation on the major component of lower electrode 22 and, for example, a metal, such as Ir, Au, Pt, $IrO_2$, $RuO_2$, $LaNiO_3$, or $SrRuO_3$, a metal oxide, or a combination thereof may be used. There is not a specific limitation on the thickness of lower electrode 22 or upper electrode 24 and, for example, it is preferable to be in the range from 50 to 500 nm.

There is not any limitation on the major component of upper electrode 24, and the example materials listed for lower electrode 22, electrode materials generally used for semiconductor processing, such as Al, Ta, Cr, and Cu, and combinations thereof may be used.

Preferably, the thickness of piezoelectric film 23 is not greater than 20 μm, and more preferably not greater than 10 μm.

Piezoelectric element structure 1 is driven by a positive voltage with upper electrode layer 24 as an address electrode and stretching or contraction of each element occurs effectively, so that piezoelectric effect produced by electric filed induced distortion may be obtained effectively. That is, when an actuator is formed using piezoelectric element structure 1, positive voltage driver $D^+$ may be used with lower electrode layer 22 as the ground (GND) electrode to which a fixed voltage is applied and upper electrode 24 as an address electrode to which varied voltage is applied. This may reduce the cost and overall size of the device in comparison with a device that uses a negative voltage driver.

Piezoelectric element structure 1 may be applied to an inkjet recording head with positive voltage driver $D^+$ and the lower portion of vibration plate 12, for example, as a pressure liquid chamber where an ink is retained. In this case, piezoelectric displacements of multi-channel ink discharge portions are equalized and amounts of ink discharge are maintained constant, leading to high image quality due to improved in-plane uniformity. Further, the use of the manufacturing method of the present invention may reduce the destruction rate of elements to substantially 0%, which increases the yield rate and reduces manufacturing costs.

EXAMPLES

Figure 7:
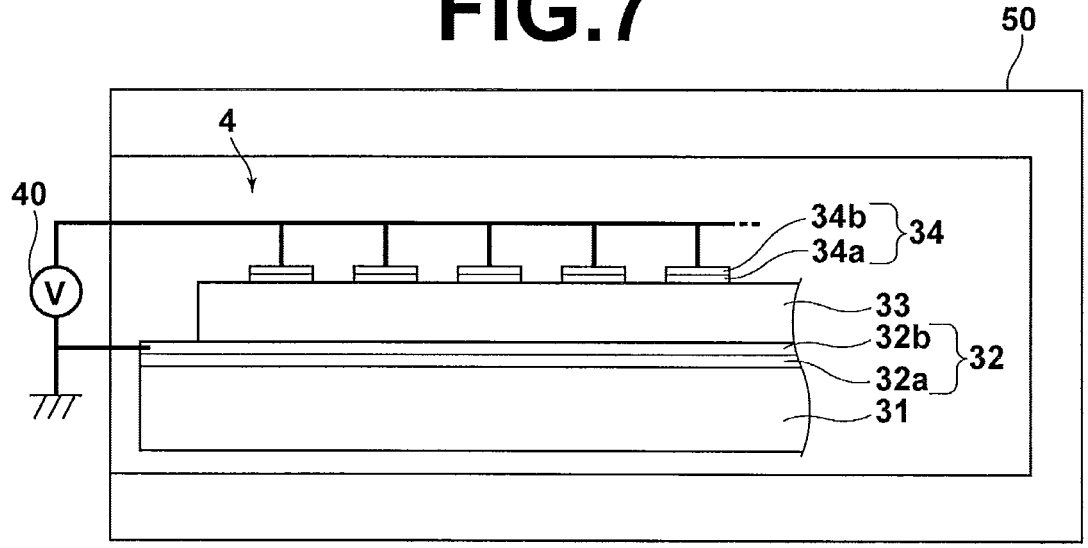
FIG. 7 is a schematic cross-sectional view of an example structure, illustrating the construction and configuration at the time of poling.
Figure 8:
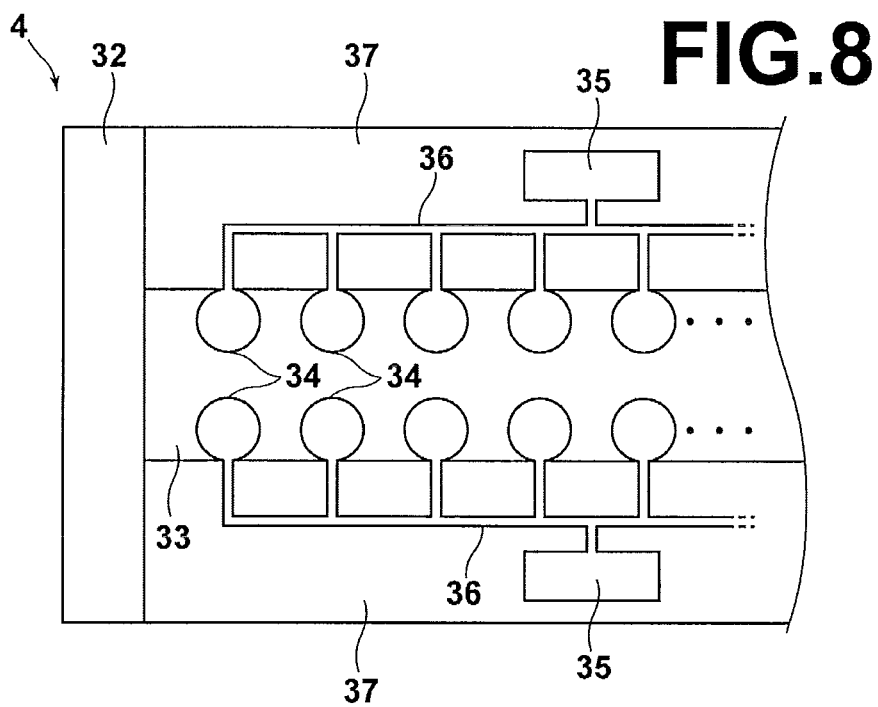
FIG. 8 is a schematic plan view of the example structure, illustrating the construction and configuration at the time of poling.

Poling was performed on a plurality of samples (samples 1 to 10), which were the structures of Nb doped PZT having a Curie point of 280° C. formed by sputtering under the first film forming condition, by applying a voltage under different temperature conditions and the results were evaluated. FIGS. 7 and 8 are conceptual diagrams of a structure, in which FIG. 7 is a schematic cross-sectional view of the structure, illustrating the configuration at the time of poling, and FIG. 8 is a schematic plan view of the structure.

Structure 4 subjected to the poling was provided by forming Ti layer 32a and Ir layer 32b, as lower electrode layer 32, on Si substrate 31, Nb doped PZT piezoelectric film 33 on lower electrode layer 32 by sputtering with a thickness of 5 μm, and upper electrode layer 34 having Ti layer 34a and Ir layer 34b on Nb doped PZT piezoelectric film 33 in a pattern. Here, electrodes for 200 channels (200 elements) were formed on Nb doped PZT piezoelectric film 33. Further, lead wire 36 was formed from each upper electrode 34 and electrode pad 35 was formed at the tail end of each lead wire 36, in which polyimide resin layer 37 was formed first and then lead wire 36 and electrode pad 35 were formed on polyimide resin layer 37.

Electrode pad 35 is connected to polarization reversal drive power source 40 by a probe, wire bonding, or flexible printed circuit (FPC) wiring and lower electrode 32 was grounded.

With respect to each of samples 1 to 10, poling was performed by placing structure 4 in cryostat 50 and maintaining inside of cryostat 50 at each temperature shown in Table 1 below. Here, the polarization reversal process was performed by simultaneously applying electric field E between the respective electrode layers (for 200 channels) under the condition of application voltage of 10 kV/mm for 10 minutes. Then, with respect to each structure after subjected to the poling, the destruction rate was calculated from the number of destroyed channels in 200 channels.

Table 1 indicates the temperature condition and destruction rate, after subjected to the poling, of each of samples 1 to 10.

TABLE 1

|  | Temp. (° C.) | Des. Rate (%) |
|---|---|---|
| Sample 1 | −20 | 0 |
| Sample 2 | −20 | 0 |
| Sample 3 | 0 | 0 |
| Sample 4 | 0 | 0 |
| Sample 5 | 10 | 0 |
| Sample 6 | 10 | 5 |
| Sample 7 | 25 | 15 |
| Sample 8 | 25 | 12 |
| Sample 9 | 100 | 40 |
| Sample 10 | 100 | 30 |

Figure 9:
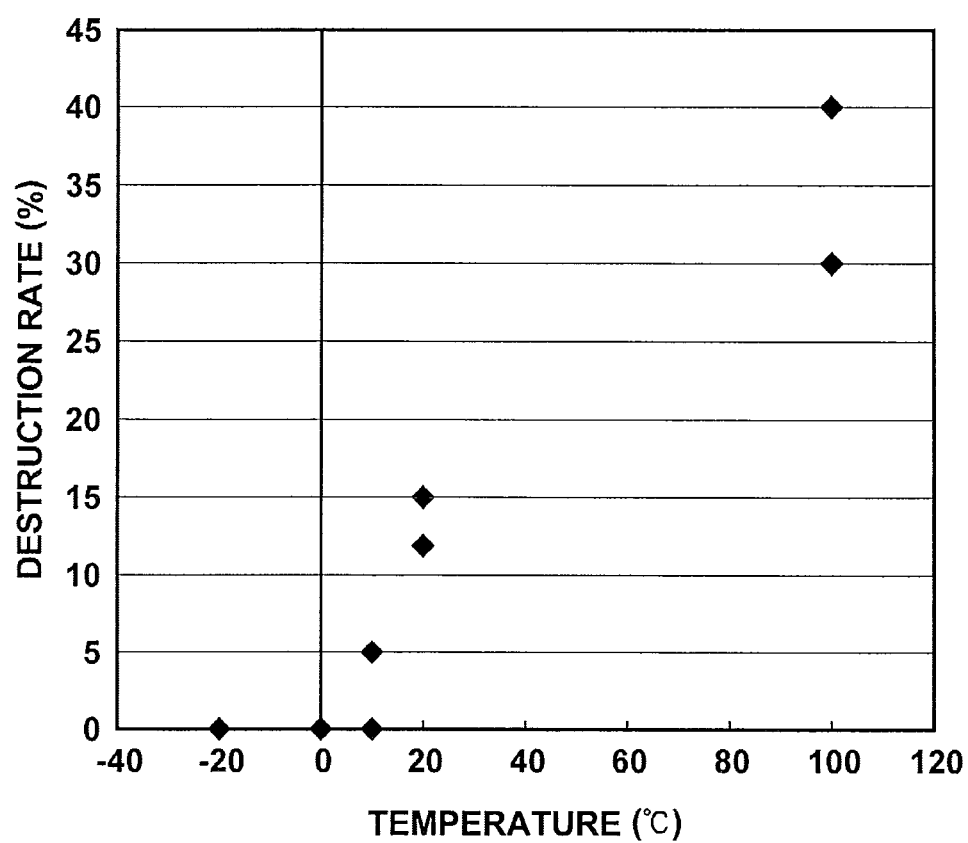
FIG. 9 is a graph illustrating the relationship between poling temperature and destruction rate in an example structure.

The results shown in Table 1 are plotted on a graph shown in FIG. 9 to illustrate the relationship between the temperature and destruction rate. Samples subjected to poling under a temperature condition of 100° C. have high destruction rates of 30% and 40%, while the destruction rates of those subjected to poling under a temperature condition of not greater than 10° C. are 0%. The result clearly shows that it is necessary to set the temperature not greater than 20° C. in order to obtain a destruction rate of not greater than 10% and it is preferable to set the temperature not greater than 0° C. in order to obtain a destruction rate of 0%.

Here, Nb doped PZT film having a Curie point of 280° C. is used as the piezoelectric film of each sample, and "temperature not greater than 20° C." corresponds to a temperature not greater than [Tc−260 (° C.)], and "temperature not greater than 0° C." corresponds to a temperature not greater than [Tc−280 (° C.)] with reference to Curie point Tc.

Industrial Applicability

The piezoelectric element structure of the present invention is preferably applied to actuators and the like mounted on inkjet recording heads, magnetic read/write heads, MEMS (micro electro-mechanical systems) devices, micropumps, ultrasonic probes, and the like.

What is claimed is:

1. A piezoelectric film poling method comprising:
providing a piezoelectric film formed on a substrate by a vapor phase growth method, said piezoelectric film having not undergone polarization treatment and having a Curie point Tc not higher than 300° C.; and
applying to said piezoelectric film an electric field that is greater than a coercive electric field of said piezoelectric film in a predetermined direction under a temperature condition not higher than 0° C. to orient spontaneous polarization of said piezoelectric film in said predetermined direction.

2. The piezoelectric film poling method of claim 1, wherein:
said piezoelectric film that has not undergone polarization treatment has a pillar crystal structure and a first spontaneous polarization of said piezoelectric film is oriented in a direction from one side of said piezoelectric film, said one side being proximate to the substrate, toward the other side of said piezoelectric film, said other side being opposite to said one side and remote from the substrate; and
a second spontaneous polarization is in said predetermined direction from said other side toward said one side of said piezoelectric film.

3. A method for manufacturing a piezoelectric element structure having a piezoelectric element which includes a substrate on which a lower electrode layer, a piezoelectric film, and an upper electrode layer are stacked in this order, the method comprising the steps of:
forming a piezoelectric film, having not undergone polarization treatment and having a Curie point Tc not higher than 300° C., by a vapor phase growth method in a film forming process in which the lower electrode layer, piezoelectric film, and upper electrode layer are serially formed on the substrate; and
applying an electric field, greater than a coercive electric field of the piezoelectric film, to the piezoelectric film in a direction from the upper electrode layer toward the lower electrode layer under a temperature condition not higher than 0° C. to manufacture a piezoelectric element structure having spontaneous polarization oriented in the direction from the upper electrode layer toward the lower electrode layer.

4. The manufacturing method of claim 3, wherein the piezoelectric film is formed of a perovskite oxide doped with at least Pb.

5. The manufacturing method of claim 3, wherein the piezoelectric film, having a pillar crystal structure is formed using a sputtering method as the vapor phase growth method.

6. The manufacturing method of claim 3, wherein the piezoelectric film is formed with a thickness not greater than 20 μm.

* * * * *